United States Patent [19]

Kohama

[11] Patent Number: 5,448,207
[45] Date of Patent: Sep. 5, 1995

[54] ATTENUATOR CIRCUIT APPARATUS

[75] Inventor: Kazumasa Kohama, Kanagawa, Japan

[73] Assignee: Sony Corporation, Tokyo, Japan

[21] Appl. No.: 305,565

[22] Filed: Sep. 14, 1994

[30] Foreign Application Priority Data

Sep. 30, 1993 [JP] Japan .................................. 5-268386

[51] Int. Cl.[6] ............................ H01P 1/22; H03H 7/24
[52] U.S. Cl. .................................. 333/81 R; 327/308; 333/81 A
[58] Field of Search ........................ 333/81 R, 81 A; 327/306, 308

[56] References Cited

U.S. PATENT DOCUMENTS 3,014,187  12/1961  Sher et al. ........................ 333/81 R
4,837,530  6/1989  Kondoh ............................ 333/81 A
5,049,841  9/1991  Cooper et al. ..................... 333/81 R

FOREIGN PATENT DOCUMENTS

WO89/11166  11/1989  WIPO .

OTHER PUBLICATIONS

F. McGrath et al., "An Ultra Broadband DC-12 GHz 4-Bit GaAs Monolithic Digital Attenuator", 13th Annual GAAS IC Symposium, Technical Digest 1991, Oct. 1991, pp. 247–250.
European Search Report dated Dec. 30, 1994, Examiner: E. Deconinck, Re: EP 94 40 2106.

*Primary Examiner*—Paul Gensler
*Attorney, Agent, or Firm*—Ronald P. Kananen

[57] ABSTRACT

An attenuator circuit which has a small insertion loss and also has a broad tolerance toward the fluctuation of the element parameter. An attenuator stage having the largest attenuation quantity of a plurality of attenuator stages is formed with a $\pi$-type attenuator stage, and an attenuator stage having the smallest attenuation quantity of the plurality of attenuator stages is formed with a T-type attenuator stage. In this way, an attenuator stage having a large attenuation quantity whose precision of the attenuation quantity is apt to be detracted is formed with a $\pi$-type attenuator stage so that the precision becomes high, further, an attenuator stage having a small attenuation quantity is formed with a T-type attenuator stage so that the insertion loss can be lowered.

4 Claims, 4 Drawing Sheets

| TYPE OF ATTENUATOR | INSERTION LOSS | VALUE OF r6 (Ω) | ATTENUATION OF 16dB BIT (dB) |
|---|---|---|---|
| TYPE A (FIG. 3) | 1.7 d B | 64.4 | 17.7 |
| | | 64.4+3 | 17.4 |
| | | 64.4-3 | 18.0 |
| TYPE B T-TYPE (FIG. 2) | 1.5 d B | 11.7 | 17.5 |
| | | 11.7+3 | 16.4 |
| | | 11.7-3 | 18.8 |
| TYPE C π-TYPE (FIG. 1) | 2.4 d B | 64.1 | 18.5 |
| | | 64.1+3 | 18.2 |
| | | 64.1-3 | 18.7 |

FIG. 4

ATTENUATOR CIRCUIT APPARATUS

BACKGROUND OF THE INVENTION

1. Field of the Invention

This invention relates to an attenuator circuit apparatus, and more particularly to an improvement of step attenuator circuit for attenuating in stages a signal such as a high frequency signal of a micro-wave band.

2. Description of the Related Art

Up to the present time, various step attenuators have been proposed to obtain an attenuated signal of plural bits with respect to a high frequency signal. Especially, when it is applied to a consumer appliance (for instance, a portable telephone), an essential condition is that it can be manufactured at a low price and in a small size. To reach these objectives an MMIC (Monolithic Microwave IC) attenuator which utilizes a GaAs FET (field effect transistor) is being developed.

These step attenuators can be divided roughly into two categories. One of them is the step attenuator in which the plural stages of the $\pi$-type attenuator circuit are connected in series with respect to the signal path as shown in FIG. 1 ("FAST GaAs MMIC ATTENUATOR HAS 5-$b$ RESOLUTION", MICROWAVE & RF OCTOBER 1991 pp.71–76). The other is the step attenuator in which the plural stages of the T-type attenuator circuit are connected in series with respect to the signal path as shown in FIG. 2 ("DC-12[GHz] 4-Bit GaAs Monolithic Digital Attenuator", Applied Microwave Winter 91/92 pp.60–67).

Thus, the step attenuator is usually composed of the $\pi$-type attenuator circuits or the T-type attenuator circuits. In the case of $\pi$-type attenuator circuit, there is a disadvantage that the insertion loss of it is larger in some degree (4 dB or more, at DC-10 GHz). This is mainly due to the increasing of the insertion loss which is caused by the electric power which leaks from these FETs, in view of the fact that there are two FETs connected in the shunt position with respect to the signal path. Therefore, this type is not suited for the realization of a step attenuator of plural bits, which requires a lower insertion loss.

On the other hand, in the case of the T-type attenuator circuit, the number of the FET which is connected in the shunt position with respect to the signal path is one. It is less than the number of the case of the $\pi$-type attenuator circuit by one, therefore, the insertion loss can be restrained to a considerably small value (2 dB or less, at DC-2 GHz). Consequently, this type is suited for the realization of the step attenuator of plural bits, which requires the lower insertion loss.

However, in the case of the T-type attenuator circuit, there was a problem that the more the attenuation quantity increases the more the attenuation quantity is affected by the dispersion of the element precision. That is, if an attempt was made to attenuate the high frequency signal which is inputted to the 50 $\Omega$ terminated signal path by 16 dB with the T-type step attenuator 5, which is comprised of the three stages connected, the resistance value of the resistor r6$a$, which is connected in the shunt position with respect to the signal path, of the resistors composing the T-type attenuator circuit 5C which is connected to the third stage becomes a very little value, that is about 10 $\Omega$.

Therefore, when the ON resistance value of the FET16 located in the shunt position or the resistance value of the resistor r6$a$ has fluctuated for some reason, the influence caused by the fluctuated quantity becomes large. For instance, when the resistance value has fluctuated by only 2 to 3 $\Omega$, this fluctuated quantity corresponds to 20 to 30% toward the resistance value of the resistor r6$a$. Hence, the attenuation quantity fluctuates extensively.

On the other hand, there is a limit to control very precisely the resistor and the FET which are located in the shunt position. Consequently, it is very difficult, in effect, to obtain a large attenuation quantity with a satisfactory precision by the T-type attenuator circuit.

SUMMARY OF THE INVENTION

In view of the foregoing, an object of this invention is to provide an attenuator circuit apparatus which is possible to obtain a high precision even though a relatively large attenuation quantity is realized.

The foregoing object and other objects of the invention have been achieved by the provision of an attenuator circuit apparatus which is comprised of a plurality of series connected attenuator stages, in which, an attenuator having the largest attenuation quantity (for instance 16 dB) of the plural attenuator stages is formed with a T-type attenuator stage 10C, and an attenuator having the smallest attenuation quantity (for instance 4 dB, 8 dB) of the plural attenuator stages is formed with T-type attenuator stages 10A, 10B.

Because an attenuator having the largest attenuation quantity of the plural attenuator stages is formed with a $\pi$-type attenuator stage 10C and an attenuator having the smallest attenuation quantity of the plural attenuator stages is formed with T-type attenuator stages 10A, 10B, the large value can be used as the resistance value of the high attenuation attenuator stage which is apt to be affected by the characteristics of the resistor or the FET. As a result, the precision of the attenuation quantity is maintained at a high precision, besides, the attenuator circuit having a low insertion loss is realized by virtue of the T-type attenuator stage.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 4 is a chart explaining the insertion loss and the influence toward the attenuation quantity which is affected by the parameter fluctuation in the attenuator circuit shown in FIG. 3.

DETAILED DESCRIPTION OF THE EMBODIMENT

Figure 3:
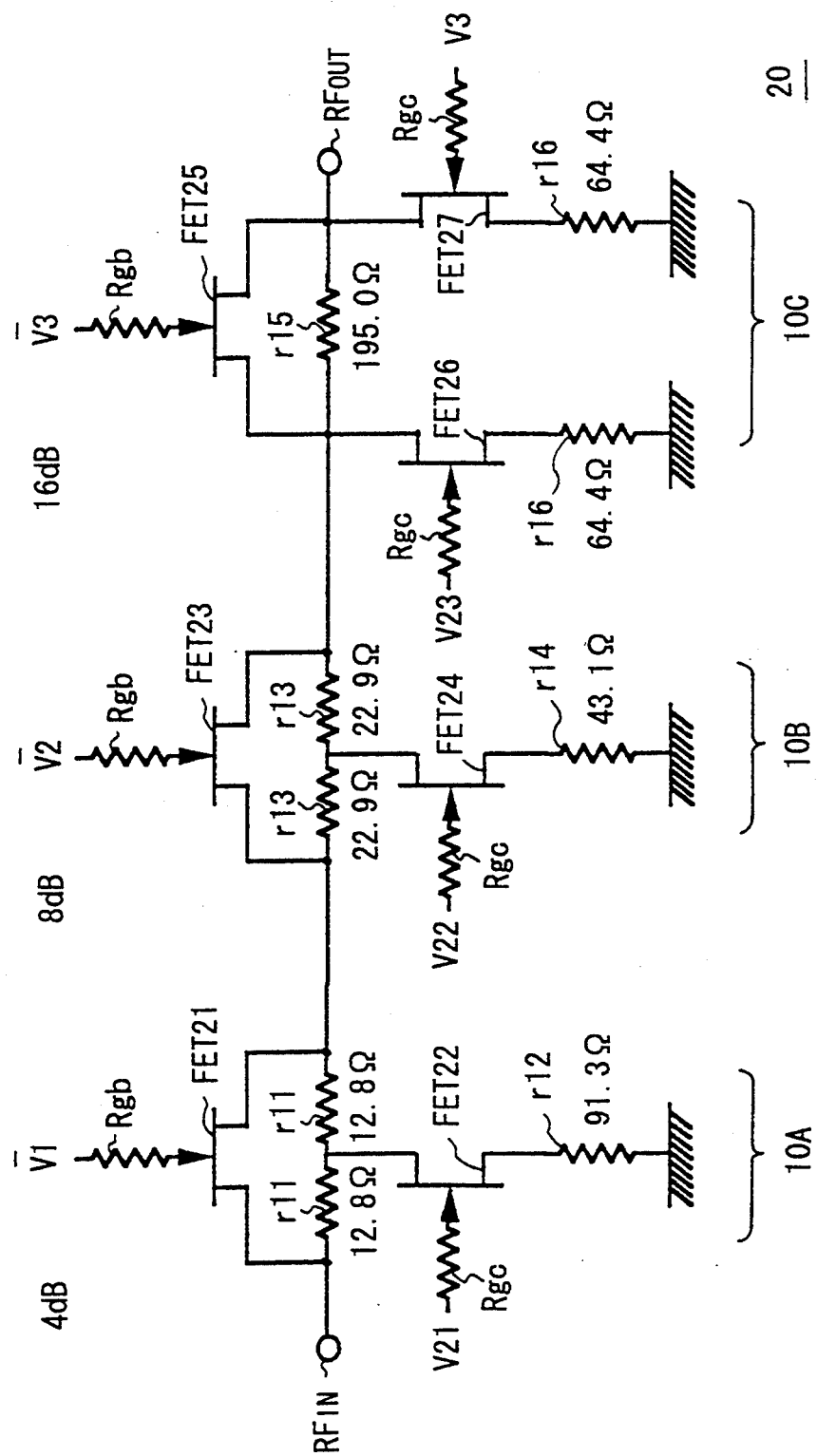
FIG. 3 is a connection diagram showing an embodiment of the attenuator circuit according to this invention.

Preferred embodiments of this invention will be described with reference to the accompanying drawings:

In FIG. 3, 20 generally denotes a digital attenuator of 3 bits 4 dB steps (that is, 4 dB, 8 dB, and 16 dB). The characteristics of this digital attenuator 20 is that a T-type attenuator circuit, which has a small insertion loss, is used for a bit whose attenuation quantity is relatively small, on the other hand, a π-type attenuator circuit, which is resistant to a parameter fluctuation, is used for a bit whose attenuation quantity is large.

In other words, T-type attenuator circuits 10A, 10B are used for attenuator stages which have small attenuation quantities such as 4 dB, 8 dB, and a π-type attenuator circuit 10C is used for an attenuator stage which has a large attenuation quantity such as 16 dB.

In this connection, a GaAs JFET (Junction FET) is used for each of FET21 to FET27 which constitute each attenuator circuit 10A, 10B, and 10C. A gate width of the JFET is 600 μm and a gate length of the JFET is 0.5 μm, and a pinch-off voltage of it is −1V.

In addition, when a high frequency signal $RF_{IN}$ of 1.5 GHz is being applied, a drain-source resistance Rds is 5.01 Ω and a total capacity $C_{total}$ is 317 pF during ON-operation (Vg=0V), a drain-source resistance Rds is 30.012 kΩ and a total capacity $C_{total}$ is 251 pF during OFF-operation (Vg=−3V).

Figure 1:
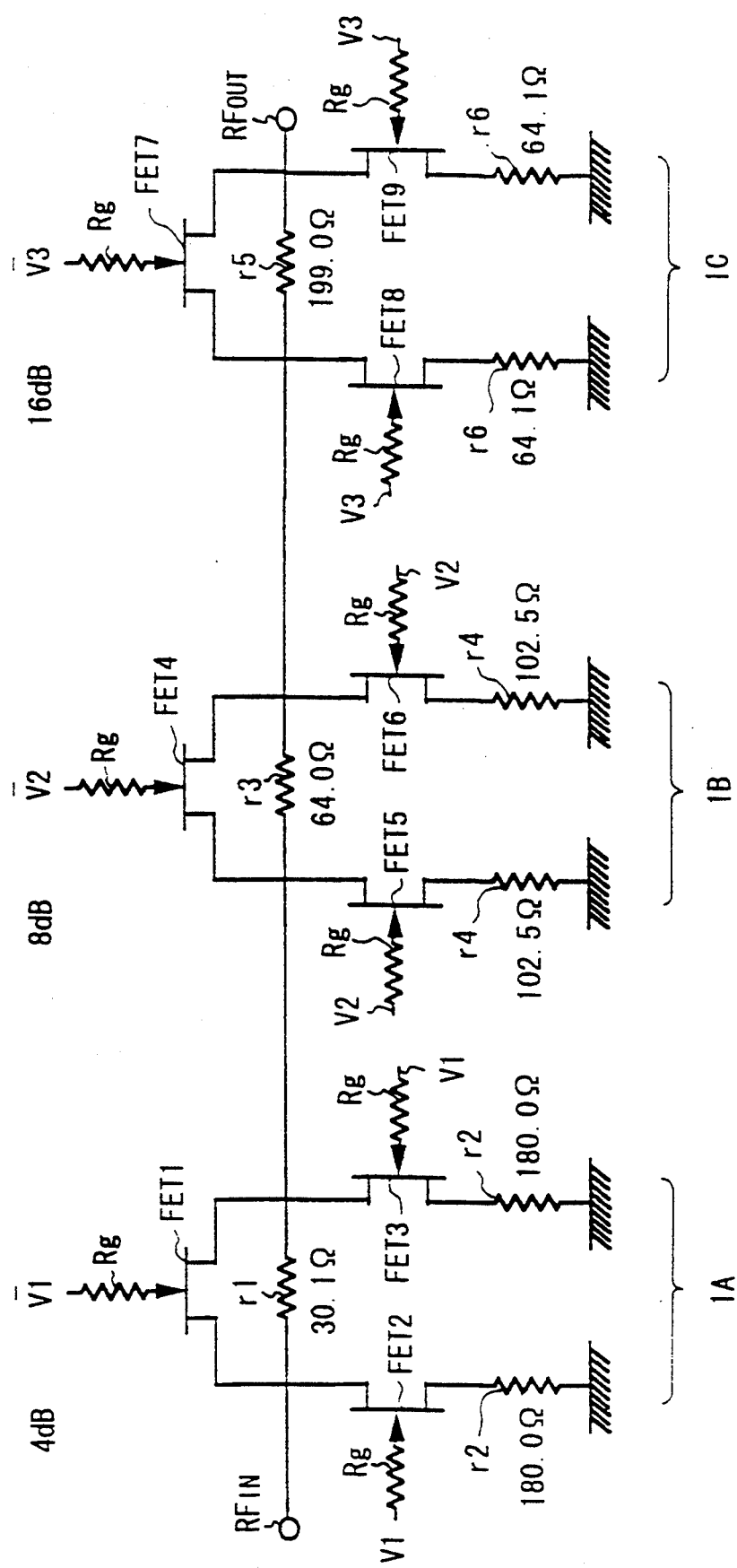
FIG. 1 is a connection diagram showing the conventional $\pi$-type step attenuator.
Figure 2:
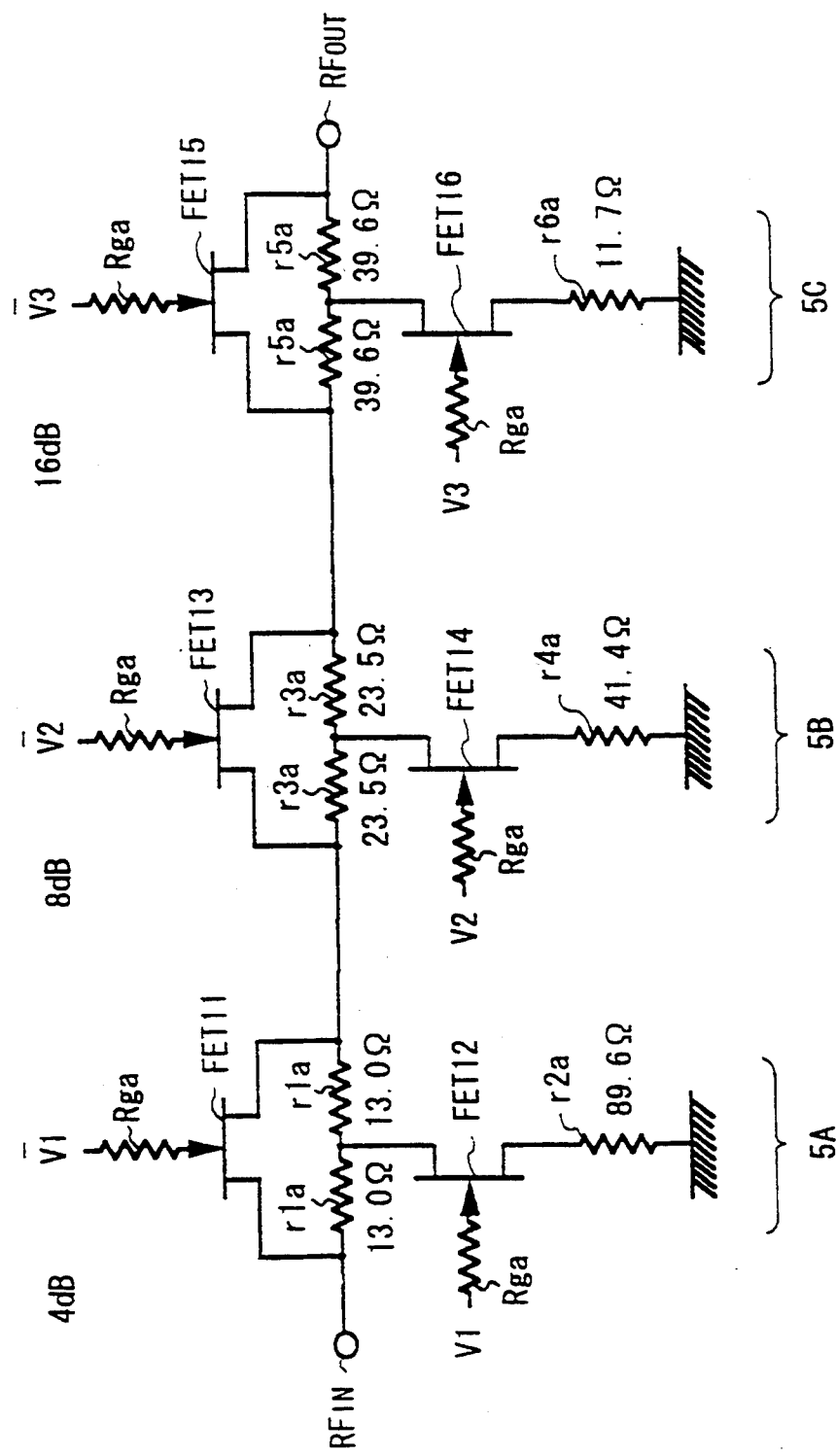
FIG. 2 is a connection diagram showing the conventional T-type step attenuator.

Upon connecting the FETs FET21 to FET27 which satisfy these conditions to the resistors r12 to r16, the resistance values of the attenuator stages which attenuate the high frequency signal $RF_{IN}$ of 1.5 GHz inputted to the signal path, which has been matched to 50[Ω], by 4[dB], 8[dB], and 16[dB] preferably are the resistance values noted in FIGS. 1 to 3.

An explanation is given of the influence to the attenuation quantity of the case where the resistance values or the characteristics of the FETs have been shifted from the designed values due to some reasons of the process etc., when the 3-bit 4[dB] step attenuator is manufactured, in the above construction. A shifting of the value of the attenuation quantity from the designed value due to the fluctuation of the element characteristics becomes a problem in particular, on the attenuator stage of the bit where the large attenuation quantity is given. Accordingly, attention is given to the attenuator stage which gives the attenuation quantity of 16[dB].

FIG. 4 illustrates the simulation result showing the insertion loss, and the situation of the fluctuation of the attenuation quantity in the case where the resistance value of the shunt portion of the 16[dB] attenuation bit has fluctuated by 3[Ω], which have been obtained with respect to each of the digital attenuator 20 which is used in the embodiment, the conventional π-type step attenuator, and the conventional T-type step attenuator.

As seen by this figure, the insertion loss of the digital attenuator 20 of the embodiment is substantially smaller than that of the π-type step attenuator, and approximately similar to that of the T-type step attenuator which has an advantageous insertion loss property. Thus, it is found that the insertion loss property of the digital attenuator 20 of the embodiment shows the satisfactory insertion loss property.

Next, an explanation is given of the influence to the attenuation quantity of the case where the resistance value of the resistors r6, r6a, r16, which constitute the shunt portion of the 16[dB] attenuation bit, has fluctuated by ±3[Ω] from the set value.

In the case of the digital attenuator 20 of the embodiment, when the resistance value of the resistor r16 has fluctuated from the set value (64.4[Ω]), it fluctuates only ±0.3[dB]. This fluctuation quantity is approximately same as the value of the fluctuation quantity of the π-type step attenuator, which is being recognized of a predominance toward a process fluctuation.

On the other hand, in the case of the T-type step attenuator which has predominated in the insertion loss property, when the resistance value of the resistor r6a fluctuates from the set value (11.7[Ω]), it fluctuates not less than 1[dB] respectively. Thus, in the case of the digital attenuator 20 of the embodiment, even if the value of the drain-source ON resistance Rds of the FETs FET26, FET27 connected to the shunt portion or the resistance value has been shifted from the set value owing to some process fluctuation, the discrepancy of the attenuation quantity is suppressed to a very little value, so that the influence is little. Thus, in the case of the digital attenuator 20, a tolerance toward the parameter fluctuation of each element due to any process fluctuation can be set to the larger value. Accordingly, it can be expected that the yield is improved considerably.

According to the above construction, a digital attenuator which has a high precision of an attenuation quantity and a low insertion loss can be realized, in view of the fact that the attenuator stage of the 16[dB] attenuation bit which has a large attenuation quantity is comprised of the π-type attenuator circuit 10C, and the fact that the attenuator stage of the 4[dB] attenuation bit and the attenuator stage of the 8[dB] attenuation bit which have little attenuation quantities are comprised of the T-type attenuator circuits 10A and 10B.

Moreover, the digital attenuator 20 can be comprised of a small number of elements, in view of the fact that the T-type attenuator circuits 10A and 10B which have a small number of elements are adopted as the 4[dB] attenuation bit and the 8[dB] attenuation bit which have little attenuation quantities.

In the embodiment described above, this invention is applied to the step attenuator which controls the attenuation quantity with 3 bits. However, this invention is not only limited to this, but may be applied to the step attenuator which controls the attenuation quantity with more than 3 bits.

Moreover, in the embodiments described above, this invention is applied to the 4[dB] step attenuator. However, this invention is not only limited to this, but may be applied to the case where a step is more than 4[dB] and also to the case where a step is less than 4[dB].

Further, in the embodiments described above, only one stage of the π-type attenuator circuit is connected to the T-type attenuator circuits. However, this invention is not only limited to this, but may be applied to the case where more than two stages of the π-type attenuator circuits are connected.

Further, in the embodiments described above, the input signal is a high frequency signal of 1.5[GHz]. However, this invention is not only limited to this, but may be widely applied to the case where the input signal extends from a direct current level to a high frequency signal of several tens[GHz] band.

Further, in the embodiments described above, it is utilized to the step attenuator for adjusting the input and output gain of the portable telephone. However, this invention is not only limited to this, but may be utilized as an outputting and gain controlling element in other mobile communication terminals. Moreover, it may be applied to various electronic apparatuses other than a mobile communication terminal.

Further, in the embodiments described above, the π-type attenuator circuit is used in place of the T-type attenuator circuit, for the attenuate circuit 10C which is required an attenuation quantity of 16[dB]. However, this invention is not only limited to this, but the π-type attenuator circuit may be used for the attenuate circuit which is required an attenuation quantity of more than 10[dB], so that the same effect as the foregoing can be obtained.

Further, in the embodiments described above, a GaAs FET is used as the FET. However, this invention is not only limited to this, a FET which is comprised of another compound semiconductor may be used. A transistor of silicon system may be used.

Further, in the embodiments described above, a JFET is used as the FET. However, this invention is not only limited to this, but may be widely applied to the case where a MESFET (Metal Semiconductor FET) is used and also to a case where a MOSFET (Metal Oxide Semiconductor FET) is used.

As described above, according to this invention, the attenuator stage having the largest attenuation quantity of the plural attenuator stages is formed with the π-type attenuator circuit, and the attenuator stage having the smallest attenuation quantity of the plural attenuator stages is formed with the T-type attenuator circuit, so that the attenuator circuit can be readily realized which maintains a higher precision of the attenuation quantity and also has a lower insertion loss.

While there has been described an arrangement in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An attenuator circuit apparatus having a plurality of series connected attenuator stages, wherein:
    an attenuator stage having the largest attenuation quantity of said plurality of attenuator stages is composed of a π-type attenuator stage; and
    an attenuator stage having the smallest attenuation quantity of said plurality of attenuator stages is composed of a T-type attenuator stage.

2. The attenuator circuit apparatus according to claim 1, wherein said π-type attenuator stage and said T-type attenuator stage comprise:
    an active element which is connected in parallel to a resistance means connected in series with respect to a signal path; and
    an active element which is connected in series with respect to a resistance means which is connected in the shunt position with respect to said signal path.

3. The attenuator circuit apparatus according to claim 1, wherein said π-type attenuator stage is utilized in such an attenuator stage of said plurality of attenuator stages that an attenuation quantity of 10 dB or more is required.

4. The attenuator circuit apparatus according to claim 2, wherein said active element is a field effect transistor whose semiconductor material is compound semiconductor.

* * * * *